US009559026B2

(12) United States Patent
Xiong et al.

(10) Patent No.: US 9,559,026 B2
(45) Date of Patent: Jan. 31, 2017

(54) SEMICONDUCTOR PACKAGE HAVING A MULTI-LAYERED BASE

(71) Applicant: Infineon Technologies Americas Corp., El Segundo, CA (US)

(72) Inventors: Shunhe Xiong, Westford, MA (US); Grant Maloney, Ashburnham, MA (US)

(73) Assignee: INFINEON TECHNOLOGIES AMERICAS CORP., El Segundo, CA (US)

( * ) Notice: Subject to any disclaimer, the term of this patent is extended or adjusted under 35 U.S.C. 154(b) by 0 days.

(21) Appl. No.: 14/948,072

(22) Filed: Nov. 20, 2015

(65) Prior Publication Data

US 2016/0254203 A1    Sep. 1, 2016

Related U.S. Application Data

(60) Provisional application No. 62/121,364, filed on Feb. 26, 2015.

(51) Int. Cl.
*H01L 23/48* (2006.01)
*H01L 23/043* (2006.01)
*H01L 23/08* (2006.01)
*H01L 23/373* (2006.01)
*H01L 23/498* (2006.01)
*H05K 1/18* (2006.01)

(52) U.S. Cl.
CPC ............. *H01L 23/043* (2013.01); *H01L 23/08* (2013.01); *H01L 23/373* (2013.01); *H01L 23/49866* (2013.01); *H05K 1/181* (2013.01)

(58) Field of Classification Search
CPC .............................. H01L 23/373; H01L 21/047
USPC .......................................... 257/690, 676, 706
See application file for complete search history.

(56) References Cited

U.S. PATENT DOCUMENTS

| 4,935,086 A | 6/1990 | Baker |
| 6,399,892 B1 | 6/2002 | Milkovich |
| 2006/0249835 A1* | 11/2006 | Miyauchi ............. H01L 23/047 257/706 |
| 2007/0126094 A1* | 6/2007 | Shojaie ................. H01L 21/568 257/676 |
| 2008/0083980 A1 | 4/2008 | Yang |
| 2011/0037179 A1 | 2/2011 | Limaye |
| 2012/0187584 A1 | 7/2012 | Lin |

* cited by examiner

*Primary Examiner* — Dung Le
(74) *Attorney, Agent, or Firm* — Slater Matsil, LLP

(57) ABSTRACT

A semiconductor package for mounting to a printed circuit board (PCB) includes a semiconductor die in a ceramic case, a conductive base coupled to the semiconductor die at a top surface of the conductive base, where the conductive base includes a first layer having a first coefficient of thermal expansion (CTE), and a second layer having at least one mounting tab and a second CTE. The conductive base is configured to reduce thermal stress in the ceramic case, where the first CTE is equal to or slightly different than a CTE of the ceramic case, the second CTE is greater than the first CTE, and a CTE of the PCB is greater than or equal to the second CTE. The conductive base is configured to electrically couple a power electrode of the semiconductor die to the PCB.

20 Claims, 4 Drawing Sheets

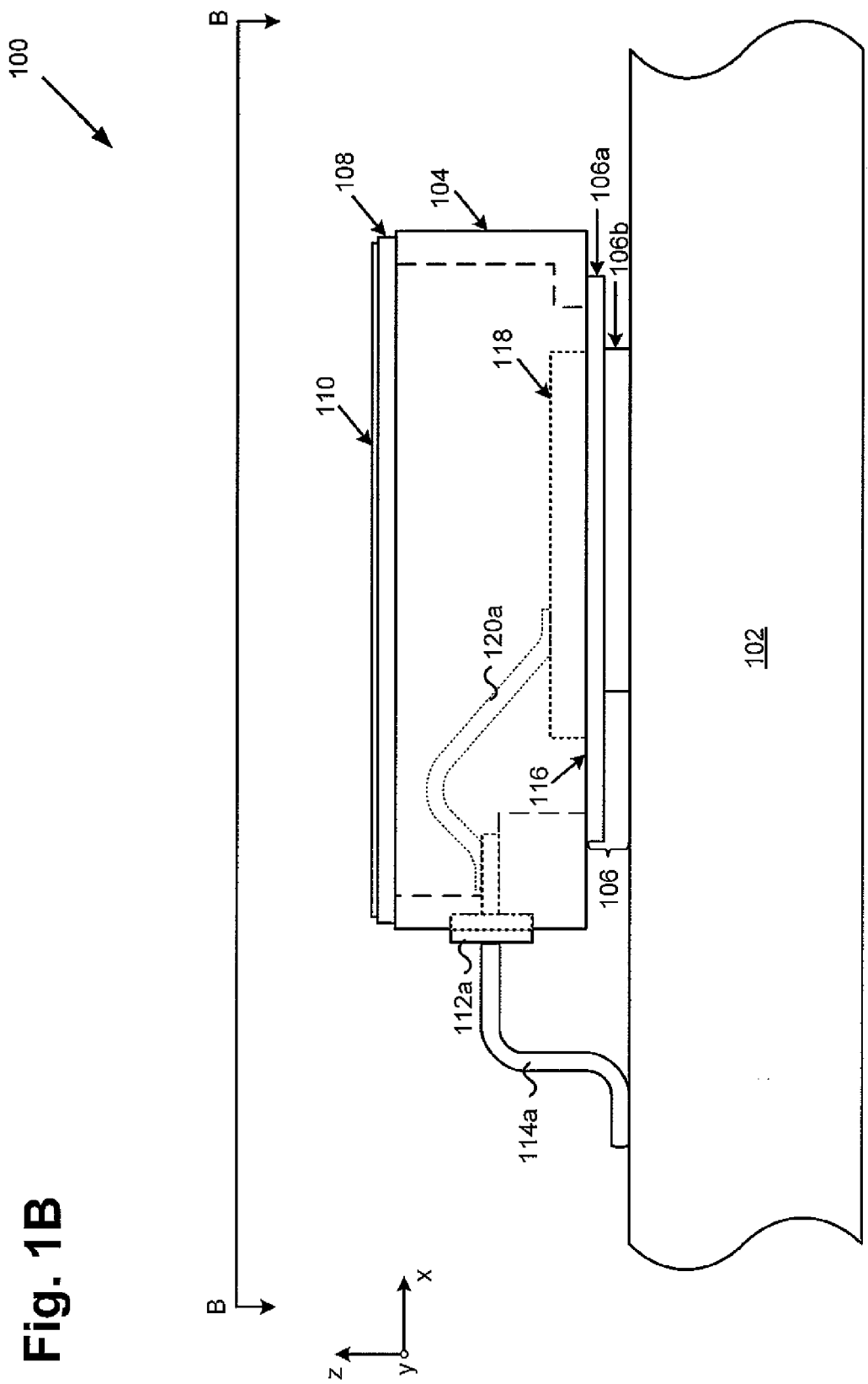

US 9,559,026 B2

SEMICONDUCTOR PACKAGE HAVING A MULTI-LAYERED BASE

The present application claims the benefit of and priority to a provisional patent application entitled "Ceramic Package with Composite Base," Ser. No. 62/121,364 filed on Feb. 26, 2015. The disclosure in this provisional application is hereby incorporated fully by reference into the present application.

BACKGROUND

Surface mount device (SMD) packages can be used to house semiconductor devices and directly connect them to printed circuit boards (PCBs). A large number of electronic circuit designs have been integrating the SMD packages due to various benefits that the surface mount devices can offer. For example, in military and space applications (e.g., high performance vehicles, aircrafts, space shuttles and satellites) where high reliability is imperative, ceramic SMD packages can provide the robustness necessary in extreme or harsh environments, while offering benefits such as smaller size, lighter weight, and excellent thermal performance.

However, the popularity of the ceramic SMD packages has been somewhat hindered by the coefficient of thermal expansion (CTE) incompatibility of the SMD package and the PCB materials, and by the increasingly wider operating temperature demands. For example, when a ceramic SMD package is mounted onto a PCB with a large CTE, a CTE mismatch between the ceramic SMD package and the PCB may introduce thermal stress to the ceramic SMD package. The thermal stress can cause cracking of the ceramic SMD package, which can result in hermeticity loss of the package and damage to the power semiconductor devices and circuitry inside the package.

Accordingly, there is a need to overcome the drawbacks and deficiencies in the art by providing a semiconductor package, such as a ceramic SMD package, that can substantially reduce fatigue and cracking of the semiconductor package due to thermal cycling.

SUMMARY

The present disclosure is directed to a semiconductor package having a multi-layered base, substantially as shown in and/or described in connection with at least one of the figures, and as set forth in the claims.

BRIEF DESCRIPTION OF THE DRAWINGS

FIG. 1B illustrates a cross-sectional view of an exemplary semiconductor package, according to one implementation of the present application.

DETAILED DESCRIPTION

Figure 1A:
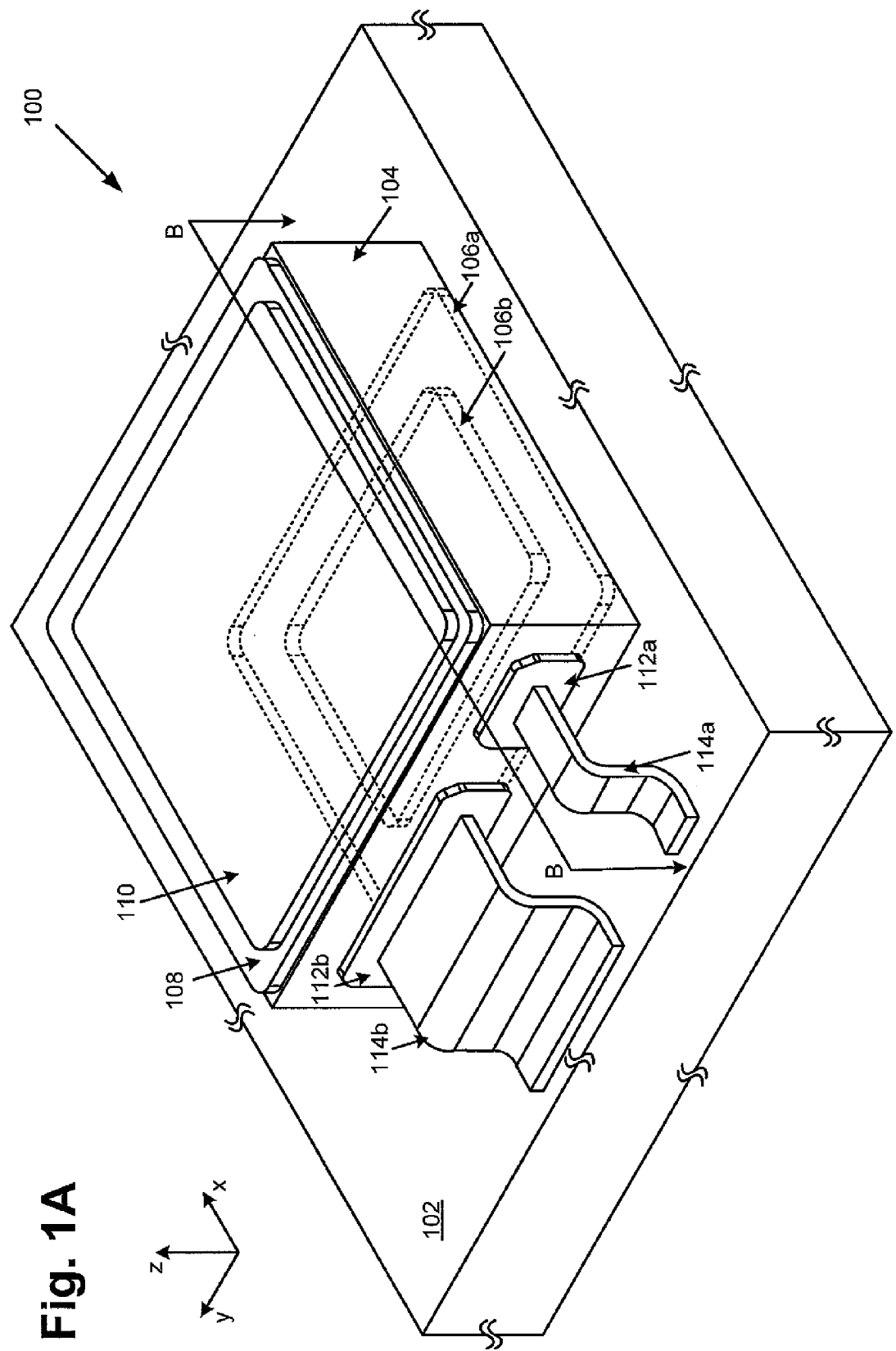
FIG. 1A illustrates a perspective view of a portion of an exemplary semiconductor package, according to one implementation of the present application.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

Referring to FIGS. 1A and 1B, FIG. 1A illustrates a perspective view of a portion of exemplary semiconductor package 100, according to one implementation of the present application. FIG. 1B illustrates a cross-sectional view of exemplary semiconductor package 100 in FIG. 1A along line B-B, according to one implementation of the present application. As illustrated in FIG. 1A, semiconductor package 100 is mounted on substrate 102. Semiconductor package 100 includes ceramic case 104, conductive base 106, seal ring 108, lid 110, eyelets or washers 112a and 112b, and leads 114a and 114b. As illustrated in FIG. 1B, semiconductor package 100 also includes semiconductor die 118 attached to top surface 116 of conductive base 106 for example, by soldering paste, through an aperture at the bottom of ceramic case 104 of semiconductor package 100.

In the present implementation, semiconductor package 100 is a hermetic surface mount device (SMD) package. For example, semiconductor die 118 is hermetically sealed in ceramic case 104, such that semiconductor package 100 is impervious to moisture and detrimental gas species. For example, ceramic case 104 may include relatively low mass density ceramic material, such as aluminum oxide or aluminum nitride. In an implementation, ceramic case 104 may have a CTE in a range of 4 to 7 parts per million per degree Centigrade (ppm/° C.). Seal ring 108 and lid 110 may include relatively high mass density material such as Kovar. In an implementation, seal ring 108 and lid 110 may each have a CTE in a range of 5 to 6 ppm/° C. As illustrated in FIG. 1A, eyelets or washers 112a and 112b are formed on a sidewall of ceramic case 104, where leads 114a and 114b extend into ceramic case 104 through eyelets or washers 112a and 112b, respectively. Leads 114a and 114b may be electrically coupled to one or more electrodes on semiconductor die 118 (shown in FIG. 1B) inside semiconductor package 100 through one or more bond wires (e.g., bond wire 120a), for example. In an implementation, eyelets or washers 112a and 112b may include ceramic material, such as aluminum oxide. In an implementation, eyelets or washers 112a and 112b may include conductive material, such as copper, copper alloy, or the like. In an implementation, leads 114a and 114b may include copper, copper alloy, or the like.

It should be understood that semiconductor package 100 having semiconductor die 118, bond wires 120a in ceramic case 104 may be encased in a molding compound (not explicitly shown in FIGS. 1A and 1B), such as by injection molding. It should also be understood that other circuit components and/or semiconductor packages (not explicitly shown in FIGS. 1A and 1B) can be formed in and/or on substrate 102. In an implementation, substrate 102 may be a printed circuit board (PCB) having one or more layers. Also, substrate 102 may include conductive traces (not explicitly shown in FIGS. 1A and 1B) for electrically connecting various other circuit components and/or semiconductor packages in or on substrate 102.

As illustrated in FIG. 1B, semiconductor die 118 is formed on top surface 116 of conductive base 106 through the aperture at the bottom of ceramic case 104 of semiconductor package 100. In an implementation, semiconductor die 118 includes one or more semiconductor devices (not explicitly shown in FIG. 1B). In an implementation, semiconductor die 118 includes group-IV semiconductor material, such as silicon, silicon carbide (SiC), or the like. In another implementation, semiconductor die 118 may include group III-V semiconductor material, such as gallium nitride (GaN), aluminum gallium nitride (AlGaN), or the like. In other implementations, semiconductor die 118 may include any other suitable semiconductor material. Also, semiconductor die 118 may include lateral and/or vertical conduction power semiconductor devices, such as metal-oxide-semiconductor field-effect transistors (FETs), insulated-gate bipolar transistors (IGBTs), power diodes, or the like. In an implementation, semiconductor die may include one or more group III-V power semiconductor devices or group IV power semiconductor devices.

As illustrated in FIG. 1B, lead 114a extends into ceramic case 104 through eyelet or washer 112a, and is electrically coupled to semiconductor die 118 through bond wire 120a. It should be understood that, similar to lead 114a, lead 114b as shown in FIG. 1A may also extend into ceramic case 104 through eyelet or washer 112b (shown in FIG. 1A), and may be electrically coupled to semiconductor die 118 through another bond wire (not explicitly shown in FIGS. 1A and 1B). In the present implementation, lead 114a may be coupled to a control electrode (e.g., gate electrode) on a top surface semiconductor die 118 in semiconductor package 100, while lead 114b may be coupled to a power electrode (e.g., source electrode) on the top surface of semiconductor die 118. Also, semiconductor die 118 may have a power electrode (e.g., drain electrode) on a bottom surface of semiconductor die 118. Terminal pad 106a of conductive base 106 is mechanically and electrically coupled to the power electrode (e.g., drain electrode) on the bottom surface of semiconductor die 118. Mounting tab 106b is mechanically and electrically coupled to substrate 102. Terminal pad 106a and mounting tab 106b may be joined together by soldering, brazing or any other process. As such, conductive base 106 electrically couples semiconductor die 118 to substrate 102 through the aperture at the bottom of ceramic case 104.

In the present implementation, conductive base 106 is a multi-layered base having at least two layers of conductive material. As illustrated in FIGS. 1A and 1B, conductive base 106 includes a first layer having terminal pad 106a mechanically and electrically coupled to the power electrode (e.g., drain electrode) on the bottom surface of semiconductor die 118 inside semiconductor package 100. According to implementations of the present application, it is important for terminal pad 106a to have a CTE that is closely matched to the CTE of ceramic case 104. In an implementation, terminal pad 106a may have a CTE equal to the CTE of ceramic case 104. In another implementation, terminal pad 106a may have a CTE slightly different (e.g., greater or less) than the CTE of ceramic case 104. For example, terminal pad 106a may have a CTE in a range of 4 to 8 ppm/° C. Since the CTE of terminal pad 106a is closely matched to the CTE of ceramic case 104, terminal pad 106a is configured to substantially reduce and/or minimize the mechanical and thermal stress on ceramic case 104 due to thermal cycling, thereby improving the structural integrity of semiconductor package 100. In the present implementation, implementation, terminal pad 106a may have a substantially uniform composition of copper-tungsten (CuW). In another implementation, terminal pad 106a may have a substantially uniform composition of any metallic or non-metallic conductive material, such as Kovar or copper-molybdenum (CuMo).

As illustrated in FIGS. 1A and 1B, conductive base 106 also includes a second layer having mounting tab 106b formed below terminal pad 106a and configured to electrically couple terminal pad 106a to substrate 102. As such, conductive base 106 having terminal pad 106a and mounting tab 106b is configured to electrically couple the power electrode of semiconductor die 118 to one or more conductive traces (not explicitly shown in FIGS. 1A and 1B) in and/or on substrate 102 through the aperture at the bottom of ceramic case 104. According to implementations of the present application, it is important for mounting tab 106b to have a CTE that is between the CTE of terminal pad 106a and the CTE of substrate 102. In one implementation, the CTE of mounting tab 106b may be greater than or equal to the CTE of terminal pad 106a, and less than or equal to the CTE of substrate 102. For example, in a case where substrate 102 is a PCB having a CTE in a range of 13 to 18 ppm/° C. (e.g., a FR4 PCB having a CTE of 13 to 14 ppm/° C. or a polyimide PCB having a CTE of 17 to 18 ppm/° C.), and ceramic case 104 of semiconductor package 100 is a ceramic case having a CTE in a range of 4 to 7 ppm/° C. (e.g., an alumina case having a CTE around 7 ppm/° C.), mounting tab 106b may have a CTE in a range of 7 to 13 ppm/° C., such as 10 ppm/° C., to provide a buffering step to relax the thermal stress resulted from the CTE mismatch between ceramic case 104 and substrate 102. In another implementation, the CTE of mounting tab 106b may be less than or equal to the CTE of terminal pad 106a, and greater than or equal to the CTE of substrate 102. For example, in a case where substrate 102 is a ceramic PCB having a CTE slightly less than the CTE of ceramic case 104, mounting tab 106b may have a CTE between the CTE of ceramic case 104 and the CTE of the ceramic PCB, for example, around 7 ppm/° C. Thus, with careful selection of the material for mounting tab 106b, implementations of the present application can effectively reduce the mechanical and thermal stress resulted from the CTE mismatch between semiconductor package 100 and substrate 102 made of any material. As such, semiconductor package 100 having mounting tab 106b can be surface mounted on all types of PCBs.

Since the CTE of mounting tab 106b is between the CTE of terminal pad 106a and the CTE of substrate 102, mounting tab 106b is configured to serve as a buffer layer to substantially reduce and/or minimize the mechanical and thermal stress resulted from the CTE mismatch between ceramic case 104 and substrate 102, thereby improving the structural integrity of semiconductor package 100 and preventing ceramic case 104 from cracking. In the present implementation, mounting tab 106b may have a substantially uniform composition of copper-molybdenum (CuMo). In another implementation, mounting tab 106b may have a substantially uniform composition of any metallic or non-metallic conductive material having a CTE between those of ceramic case 104 and substrate 102, such as copper-tungsten.

Thus, conductive base 106, having terminal pad 106a with a CTE closed matched to that of ceramic case 104, and mounting tab 106b with a CTE between those of ceramic case 104 and substrate 102, can provide a gradual change in CTE between semiconductor package 100 and substrate 102 such that the mechanical and thermal stress resulted from the CTE mismatch between semiconductor package 100 and substrate 102 can be substantially reduced and/or minimized.

As illustrated in FIGS. 1A and 1B, mounting tab 106b does not extend to the edges of terminal pad 106a in the x-direction and the y-direction. It has been found by the inventors of the present application that the CTE mismatch between ceramic case 104 and substrate 102 requires a certain amount of length (e.g., in the x-direction) and a certain amount of width (e.g., in the y-direction) for the mechanical and thermal stress to build up. Thus, a reduction in size of mounting tab 106b in the x- and y-directions can significantly reduce the amount of in-plane (e.g., x-y plane) mechanical and thermal stress on ceramic case 104. It can also reduce the mechanical and thermal stress at the solder joint between mounting tab 106b and substrate 102. In addition, mounting tab 106b of conductive base 106 can provide a large clearance between semiconductor package 100 and substrate 102, which makes removing flux residue after soldering semiconductor package 100 to substrate 102 much easier.

Figure 2A:
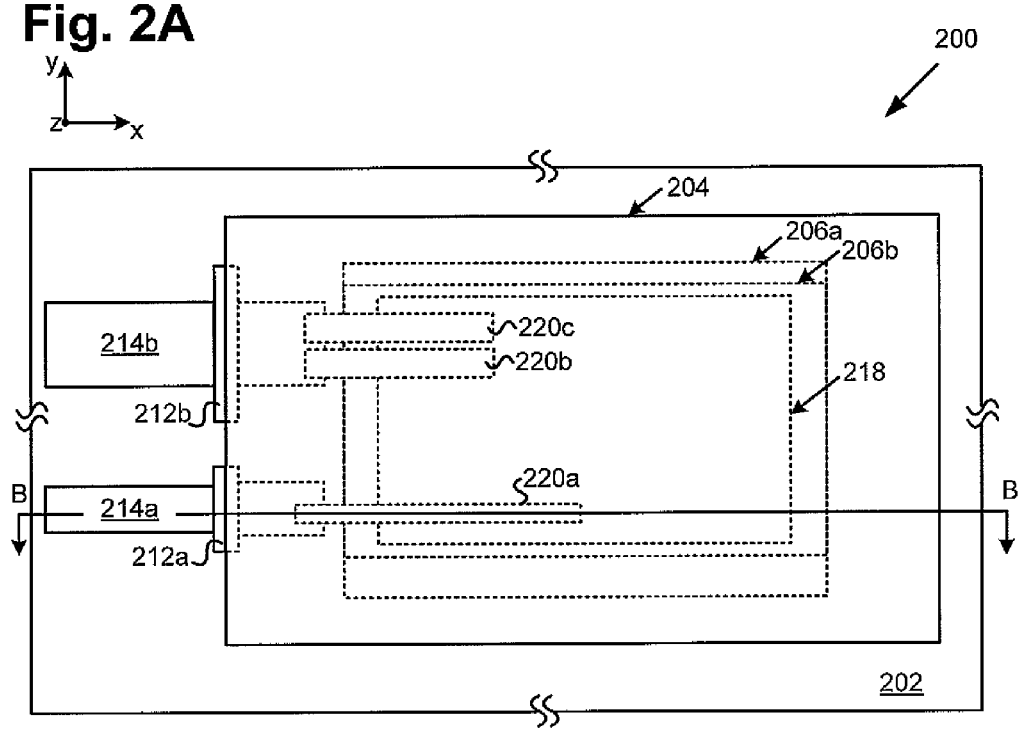
FIG. 2A illustrates a top plan view of a portion of an exemplary semiconductor package, according to one implementation of the present application.
Figure 2B:
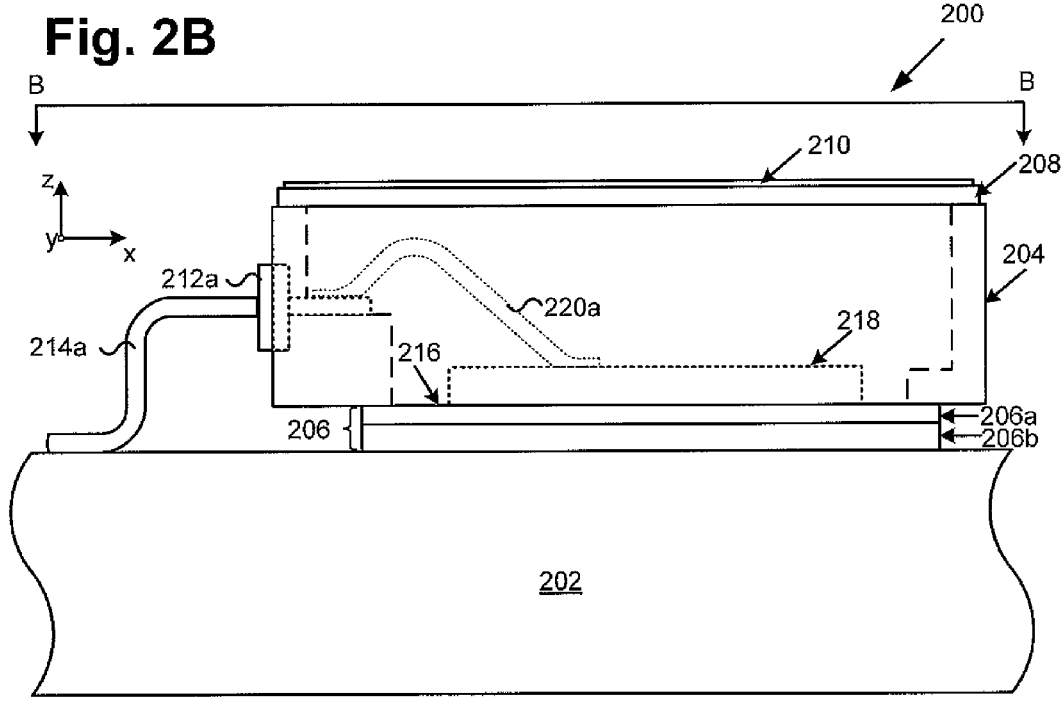
FIG. 2B illustrates a cross-sectional view of an exemplary semiconductor package, according to one implementation of the present application.

Referring to FIGS. 2A and 2B, FIG. 2A illustrates a top plan view of a portion of exemplary semiconductor package 200, according to one implementation of the present application. FIG. 2B illustrates a cross-sectional view of exemplary semiconductor package 200 in FIG. 2A along line B-B, according to one implementation of the present application. As illustrated in FIG. 2A, with similar numerals representing similar features in semiconductor package 100 in FIGS. 1A and 1B, semiconductor package 200 is mounted on substrate 202, such as a PCB. Semiconductor package 200 includes ceramic case 204, conductive base 206, seal ring 208, lid 210, eyelets or washers 212a and 212b, leads 214a and 214b, bond wires 220a, 220b and 220c, and semiconductor die 218. It is noted that seal ring 208 and lid 210 of semiconductor package 200 are omitted in FIG. 2A for clarity, but would otherwise be included as shown in FIG. 2B.

As illustrated in FIGS. 2A and 2B, semiconductor package 200, semiconductor die 218 is attached to top surface 216 of conductive base 206, for example, by soldering paste, through an aperture at the bottom of ceramic case 204. In an implementation, semiconductor die 218 includes one or more semiconductor devices (not explicitly shown in FIG. 2A). In an implementation, semiconductor die 218 includes group-IV semiconductor material, such as silicon, silicon carbide (SiC), or the like. In another implementation, semiconductor die 218 may include group III-V semiconductor material, such as gallium nitride (GaN), aluminum gallium nitride (AlGaN, or the like. In other implementations, semiconductor die 218 may include any other suitable semiconductor material. Also, semiconductor die 218 may include lateral and/or vertical conduction power semiconductor devices, such as metal-oxide-semiconductor field-effect transistors (FETs), insulated-gate bipolar transistors (IGBTs), power diodes, or the like.

As illustrated in FIG. 2A, lead 214a extends into ceramic case 204 through eyelet or washer 212a, and is electrically coupled to semiconductor die 218 through bond wire 220a. Lead 214b extends into ceramic case 204 through eyelet or washer 212b, and is electrically coupled to semiconductor die 218 through bond wires 220b and 220c. In the present implementation, lead 214a may be coupled to a control electrode (e.g., gate electrode) on a top surface semiconductor die 218 in semiconductor package 200, while lead 214b may be coupled to a power electrode (e.g., source electrode) on the top surface of semiconductor die 218. Also, semiconductor die 218 may have a power electrode (e.g., drain electrode) on a bottom surface of semiconductor die 218. Terminal pad 206a of conductive base 206 is mechanically and electrically coupled to the power electrode (e.g., drain electrode) on the bottom surface of semiconductor die 218. Mounting tab 206b is mechanically and electrically coupled to substrate 202. Terminal pad 206a and mounting tab 206b may be joined together by soldering, brazing or any other process. As such, conductive base 206 electrically couples semiconductor die 218 to substrate 202 through the aperture at the bottom of ceramic case 204.

In the present implementation, conductive base 206 is a multi-layered base having at least two layers of conductive material. As illustrated in FIGS. 2A and 2B, conductive base 206 includes a first layer having terminal pad 206a mechanically and electrically coupled to the power electrode (e.g., drain electrode) on the bottom surface of semiconductor die 218 inside semiconductor package 200. According to implementations of the present application, it is important for terminal pad 206a to have a CTE that is closely matched to the CTE of ceramic case 204. In an implementation, terminal pad 206a may have a CTE equal to the CTE of ceramic case 204. In another implementation, terminal pad 206a may have a CTE slightly different (e.g., greater or less) than the CTE of ceramic case 204. For example, terminal pad 206a may have a CTE in a range of 4 to 8 ppm/° C. Since the CTE of terminal pad 206a is closely matched to the CTE of ceramic case 204, terminal pad 206a is configured to substantially reduce and/or minimize the mechanical and thermal stress on ceramic case 204 due to thermal cycling, thereby improving the structural integrity of semiconductor package 200. In the present implementation, implementation, terminal pad 206a may have a substantially uniform composition of copper-tungsten (CuW). In another implementation, terminal pad 206a may have a substantially uniform composition of any metallic or non-metallic conductive material, such as Kovar or copper-molybdenum (CuMo).

As illustrated in FIGS. 2A and 2B, conductive base 206 also includes a second layer having mounting tab 206b formed below terminal pad 206a and configured to electrically couple terminal pad 206a to substrate 202. As such, conductive base 206 having terminal pad 206a and mounting tab 206b is configured to electrically couple the power electrode of semiconductor die 218 to one or more conductive traces (not explicitly shown in FIGS. 2A and 2B) in and/or on substrate 202 through the aperture at the bottom of ceramic case 204. According to implementations of the present application, it is important for mounting tab 206b to have a CTE that is between the CTE of terminal pad 206a and the CTE of substrate 202. In one implementation, the CTE of mounting tab 206b may be greater than or equal to the CTE of terminal pad 206a, and less than or equal to the CTE of substrate 202. For example, in a case where substrate 202 is a PCB having a CTE in a range of 13 to 18 ppm/° C. (e.g., a FR4 PCB having a CTE of 13 to 14 ppm/° C. or a polyimide PCB having a CTE of 17 to 18 ppm/° C.), and ceramic case 204 of semiconductor package 200 is a ceramic case having a CTE in a range of 4 to 7 ppm/° C. (e.g., an alumina case having a CTE around 7 ppm/° C.), mounting tab 206b may have a CTE in a range of 7 to 13 ppm/° C., such as 10 ppm/° C., to provide a buffering step to relax the thermal stress resulted from the CTE mismatch between ceramic case 204 and substrate 202. In another implementation, the CTE of mounting tab 206b may be less than or equal to the CTE of terminal pad 206a, and greater than or equal to the CTE of substrate 202. For example, in a case where substrate 202 is a ceramic PCB having a CTE slightly less than the CTE of ceramic case 204, mounting tab 206b may have a CTE between the CTE of ceramic case 104 and the CTE of the ceramic PCB, for example, around 7 ppm/° C. Thus, with careful selection of the material for mounting tab 206b, implementations of the present application can effectively reduce the mechanical and thermal stress resulted from the CTE mismatch between semiconductor package 200 and substrate 202 made of any material. As such, semiconductor package 200 having mounting tab 206b can be surface mounted on all types of PCBs.

Since the CTE of mounting tab 206b is between the CTE of terminal pad 206a and the CTE of substrate 202, mounting tab 206b is configured to serve as a buffer layer to substantially reduce and/or minimize the mechanical and thermal stress resulted from the CTE mismatch between ceramic case 204 and substrate 202, thereby improving the structural integrity of semiconductor package 200 and preventing ceramic case 204 from cracking. In the present implementation, mounting tab 206b may have a substantially uniform composition of copper-molybdenum (CuMo). In another implementation, mounting tab 206b may have a substantially uniform composition of any metallic or non-metallic conductive material having a CTE between those of ceramic case 204 and substrate 202, such as copper-tungsten.

Thus, conductive base 206, having terminal pad 206a with a CTE closed matched to that of ceramic case 204, and mounting tab 206b with a CTE between those of ceramic case 204 and substrate 202, can provide a gradual change in CTE between semiconductor package 200 and substrate 202 such that the mechanical and thermal stress resulted from the CTE mismatch between semiconductor package 200 and substrate 202 can be substantially reduced and/or minimized.

As illustrated in FIGS. 2A and 2B, mounting tab 206b and terminal pad 206a have the same length in the x-direction. However, in the present implementation, mounting tab 206b does not extend to the edges of terminal pad 206a in the y-direction. Thus, a reduction in size of mounting tab 206b in y-direction can significantly reduce the amount of in-plane (e.g., x-y plane) mechanical and thermal stress on ceramic case 204. It can also reduce the thermal and mechanical stress at the solder joint between mounting tab 206b and substrate 202. In addition, mounting tab 206b of conductive base 206 can also provide a large clearance between semiconductor package 200 and substrate 202, which makes removing flux residue after soldering semiconductor package 200 to substrate 202 much easier. In one implementation, mounting tab 206b and terminal pad 206a may have the same length (e.g., in the x-direction) and the same width (e.g., in the y-direction).

Figure 3A:
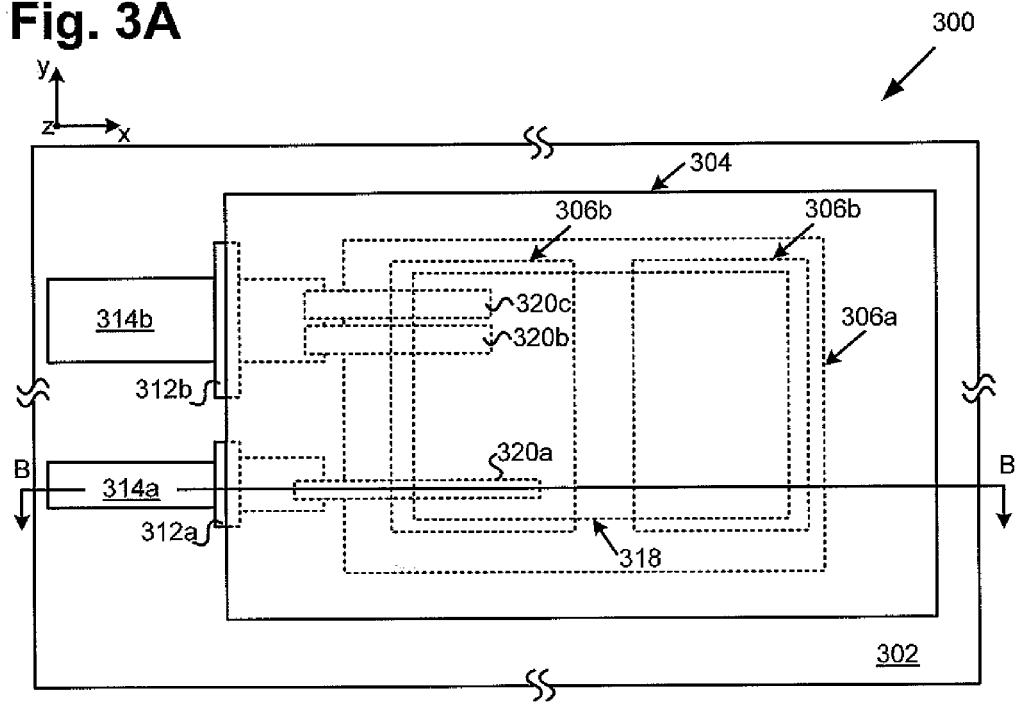
FIG. 3A illustrates a top plan view of a portion of an exemplary semiconductor package, according to one implementation of the present application.
Figure 3B:
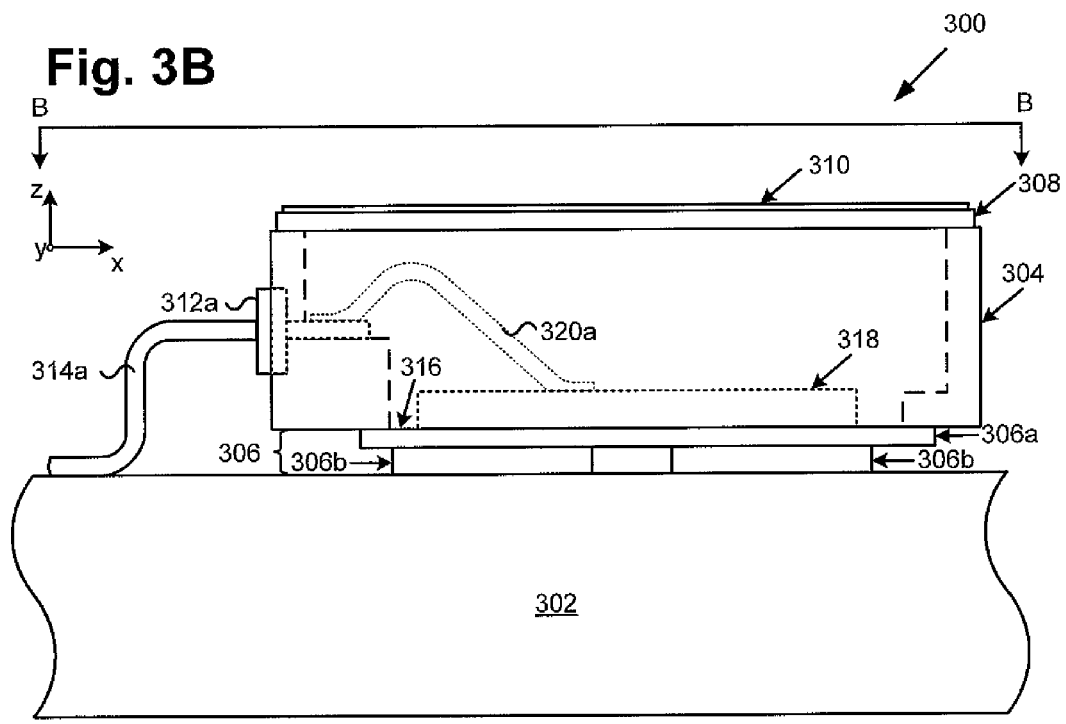
FIG. 3B illustrates a cross-sectional view of an exemplary semiconductor package, according to one implementation of the present application.

Referring to FIGS. 3A and 3B, FIG. 3A illustrates a top plan view of a portion of exemplary semiconductor package 300, according to one implementation of the present application. FIG. 3B illustrates a cross-sectional view of exemplary semiconductor package 300 in FIG. 3A along line B-B, according to one implementation of the present application. As illustrated in FIG. 3A, with similar numerals representing similar features in semiconductor package 100 in FIGS. 1A and 1B, semiconductor package 300 is mounted on substrate 302, such as a PCB. Semiconductor package 300 includes ceramic case 304, conductive base 306, seal ring 308, lid 310, eyelets or washers 312a and 312b, leads 314a and 314b, bond wires 320a, 320b and 320c, and semiconductor die 318. It is noted that seal ring 308 and lid 310 of semiconductor package 300 are omitted in FIG. 3A for clarity, but would otherwise be included as shown in FIG. 3B.

As illustrated in FIGS. 3A and 3B, semiconductor package 300, semiconductor die 318 is attached to top surface 316 of conductive base 206, for example, by soldering paste, through an aperture at the bottom of ceramic case 304. In an implementation, semiconductor die 318 includes one or more semiconductor devices (not explicitly shown in FIG. 3A). In an implementation, semiconductor die 318 includes group-IV semiconductor material, such as silicon, silicon carbide (SiC), or the like. In another implementation, semiconductor die 318 may include group III-V semiconductor material, such as gallium nitride (GaN), aluminum gallium nitride (AlGaN), or the like. In other implementations, semiconductor die 318 may include any other suitable semiconductor material. Also, semiconductor die 318 may include lateral and/or vertical conduction power semiconductor devices, such as metal-oxide-semiconductor field-effect transistors (FETs), insulated-gate bipolar transistors (IGBTs), power diodes, or the like.

As illustrated in FIG. 3A, lead 314a extends into ceramic case 304 through eyelet or washer 312a, and is electrically coupled to semiconductor die 318 through bond wire 320a. Lead 314b extends into ceramic case 304 through eyelet or washer 312b, and is electrically coupled to semiconductor die 318 through bond wires 320b and 320c. In the present implementation, lead 314a may be coupled to a control electrode (e.g., gate electrode) on a top surface semiconductor die 318 in semiconductor package 300, while lead 314b may be coupled to a power electrode (e.g., source electrode) on the top surface of semiconductor die 318. Also, semiconductor die 318 may have a power electrode (e.g., drain electrode) on a bottom surface of semiconductor die 318. Terminal pad 306a of conductive base 306 is mechanically and electrically coupled to the power electrode (e.g., drain electrode) on the bottom surface of semiconductor die 318. Mounting tabs 306b are mechanically and electrically coupled to substrate 302. Terminal pad 306a and mounting tabs 306b may be joined together by soldering, brazing or any other process. As such, conductive base 306 electrically couples semiconductor die 318 to substrate 302 through the aperture at the bottom of ceramic case 304.

In the present implementation, conductive base 306 is a multi-layered base having at least two layers of conductive material. As illustrated in FIGS. 3A and 3B, conductive base 306 includes a first layer having terminal pad 306a mechanically and electrically coupled to the power electrode (e.g., drain electrode) on the bottom surface of semiconductor die 318 inside semiconductor package 300. According to implementations of the present application, it is important for terminal pad 306a to have a CTE that is closely matched to the CTE of ceramic case 304. In an implementation, terminal pad 306a may have a CTE equal to the CTE of ceramic case 304. In another implementation, terminal pad 306a may have a CTE slightly different (e.g., greater or less) than the CTE of ceramic case 304. For example, terminal pad 306a may have a CTE in a range of 4 to 8 ppm/° C. Since the CTE of terminal pad 306a is closely matched to the CTE of ceramic case 304, terminal pad 306a is configured to substantially reduce and/or minimize the mechanical and thermal stress on ceramic case 304 due to thermal cycling, thereby improving the structural integrity of semiconductor package 300. In the present implementation, implementation, terminal pad 306a may have a substantially uniform composition of copper-tungsten (CuW). In another implementation, terminal pad 306a may have a substantially uniform composition of any metallic or non-metallic conductive material, such as Kovar or copper-molybdenum (CuMo).

As illustrated in FIGS. 3A and 3B, conductive base 306 also includes a second layer having mounting tabs 306b formed below terminal pad 306a and configured to electrically couple terminal pad 306a to substrate 302. As such, conductive base 306 having terminal pad 306a and mounting tabs 306b is configured to electrically couple the power electrode of semiconductor die 318 to one or more conductive traces (not explicitly shown in FIGS. 3A and 3B) in and/or on substrate 302 through the aperture at the bottom of ceramic case 304. According to an implementation of the present application, it is important for mounting tabs 306b to have a CTE that is between the CTE of terminal pad 306a and the CTE of substrate 302. In one implementation, the CTE of mounting tabs 306b may be greater than or equal to the CTE of terminal pad 306a, and less than or equal to the CTE of substrate 302. For example, in a case where substrate 302 is a PCB having a CTE in a range of 13 to 18 ppm/° C. (e.g., a FR4 PCB having a CTE of 13 to 14 ppm/° C. or a polyimide PCB having a CTE of 17 to 18 ppm/° C.), and ceramic case 304 of semiconductor package 300 is a ceramic case having a CTE in a range of 4 to 7 ppm/° C. (e.g., an alumina case having a CTE around 7 ppm/° C.), mounting tabs 306b may each have a CTE in a range of 7 to 13 ppm/° C., such as 10 ppm/° C., to provide a buffering step to relax the thermal stress resulted from the CTE mismatch between ceramic case 304 and substrate 302. In another implementation, the CTE of mounting tabs 206b may be less than or equal to the CTE of terminal pad 306a, and greater than or equal to the CTE of substrate 302. For example, in a case where substrate 302 is a ceramic PCB having a CTE slightly less than the CTE of ceramic case 304, mounting tabs 306b may each have a CTE between the CTE of ceramic case 304 and the CTE of the ceramic PCB, for example, around 7 ppm/° C. Thus, with careful selection of the material for mounting tabs 306b, implementations of the present application can effectively reduce the mechanical and thermal stress resulted from the CTE mismatch between semiconductor package 300 and substrate 302 made of any material. As such, semiconductor package 300 having mounting tabs 306b can be surface mounted on all types of PCBs.

Since the CTE of mounting tabs 306b is between the CTE of terminal pad 306a and the CTE of substrate 302, mounting tabs 306b are configured to serve as a buffer layer to substantially reduce and/or minimize the mechanical and thermal stress resulted from the CTE mismatch between ceramic case 304 and substrate 302, thereby improving the structural integrity of semiconductor package 300 and preventing ceramic case 304 from cracking. In the present implementation, implementation, mounting tabs 306b may each have a substantially uniform composition of copper-molybdenum (CuMo). In another implementation, mounting tabs 306b may each have a substantially uniform composition of any metallic or non-metallic conductive material, such as copper-tungsten.

Thus, conductive base 306, having terminal pad 306a with a CTE closed matched to that of ceramic case 304, and mounting tabs 306b with a CTE between those of ceramic case 304 and substrate 302, can provide a gradual change in CTE between semiconductor package 300 and substrate 302, such that the mechanical and thermal stress resulted from the CTE mismatch between semiconductor package 300 and substrate 302 can be substantially reduced and/or minimized.

As illustrated in FIGS. 3A and 3B, each of mounting tabs 306b does not extend to the edges of terminal pad 306a in the x-direction and the y-direction. Thus, a reduction in size of each of mounting tabs 306b in the x- and y-directions can significantly reduce the amount of in-plane (e.g., x-y plane) mechanical and thermal stress on ceramic case 304. It can also reduce the thermal and mechanical stress at the solder joint between mounting tabs 306b and substrate 302. In addition, mounting tabs 306b of conductive base 306 can also provide a large clearance between semiconductor package 300 and substrate 302, which makes removing flux residue after soldering semiconductor package 300 to substrate 302 much easier. It should be understood that the second layer of conductive base 306 may have more than two mounting tabs 306b. For example, in one implementation, the second layer of conductive base 306 may have four mounting tabs 306b near each corner of terminal pad 306a. Multiple mounting tabs 306b can disperse the total amount of in-plane mechanical and thermal stress into several localized regions, thereby reduce the overall mechanical and thermal stress on ceramic case 304.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. A semiconductor package for mounting to a printed circuit board (PCB), said semiconductor package comprising:
   a semiconductor die in a ceramic case;
   a conductive base coupled to said semiconductor die at a top surface of said conductive base; and
   wherein said conductive base comprises a first layer having a first coefficient of thermal expansion (CTE), and a second layer, wherein the second layer comprises a first mounting tab overlapping a first corner of the first layer and a second mounting tab overlapping a second corner of the first layer, wherein the first mounting tab and the second mounting tab have a second CTE, wherein said first CTE is similar to a CTE of the ceramic case, and wherein said second CTE is greater than said first CTE.

2. The semiconductor package of claim 1, wherein a CTE of said PCB is greater than or equal to said second CTE.

3. The semiconductor package of claim 1, wherein said first layer of said conductive base comprises copper-tungsten.

4. The semiconductor package of claim 3, wherein said second layer of said conductive base comprises copper-molybdenum (CuMo).

5. The semiconductor package of claim 1, wherein said conductive base is configured to electrically couple a power electrode of said semiconductor die to said PCB.

6. The semiconductor package of claim 1, wherein said semiconductor die is hermetically sealed in said ceramic case.

7. The semiconductor package of claim 1, wherein said semiconductor die comprises a group III-V power semiconductor device or a group IV power semiconductor device.

8. The semiconductor package of claim 1, wherein said semiconductor die comprises a power field effect transistor, a power insulated-gate bipolar transistor or a power diode.

9. A surface mount device (SMD) package comprising:
a semiconductor die hermetically sealed in a ceramic case;
a conductive base coupled to a power electrode of said semiconductor die at a top surface of said conductive base; and
wherein said conductive base comprises a first layer having a first coefficient of thermal expansion (CTE), and a second layer, wherein the second layer comprises a first mounting tab overlapping a first peripheral region of the first layer and a second mounting tab overlapping a second peripheral region of the first layer, wherein the first mounting tab and the second mounting tab have a second CTE, wherein said first CTE is similar to a CTE of the ceramic case, and wherein said second CTE is greater than said first CTE.

10. The SMD package of claim 9, wherein said second layer of said conductive base is mounted to a printed circuit board (PCB).

11. The SMD package of claim 10, wherein a CTE of said PCB is greater than or equal to said second CTE.

12. The SMD package of claim 9, wherein said first layer of said conductive base comprises copper-tungsten.

13. The SMD package of claim 12, wherein said second layer of said conductive base comprises copper-molybdenum (CuMo).

14. The SMD package of claim 9, wherein said semiconductor die comprises a III-nitride power semiconductor device or a group IV power semiconductor device.

15. The SMD package of claim 9, wherein said semiconductor die comprises a power field effect transistor, a power insulated-gate bipolar transistor or a power diode.

16. The SMD package of claim 9, wherein said semiconductor die comprises a vertical conduction power semiconductor device.

17. The semiconductor package of claim 1, further comprising:
a third segment overlapping a third corner of the first layer and a fourth segment overlapping a fourth corner of the first layer.

18. A semiconductor package for mounting to a printed circuit board (PCB), the semiconductor package comprising:
a ceramic case;
a semiconductor die disposed in the ceramic case, wherein the package is hermetically sealed;
a lid disposed over the ceramic case and sealed with a seal ring, wherein the lid comprises a higher density material than the ceramic case;
a first conductive mounting tab extending out of a major surface of the ceramic case, the first conductive mounting tab covering the semiconductor die and contacting an electrode of the semiconductor die;
a second conductive mounting tab disposed on the first conductive mounting tab, the second conductive mounting tab being shorter than the first conductive mounting tab, wherein the second conductive mounting tab is located at a first corner region; and
a third conductive mounting tab disposed on the first conductive mounting tab, wherein the third conductive mounting tab is located at a second corner region opposite the first corner region, wherein the first conductive mounting tab has a first coefficient of thermal expansion greater than a coefficient of thermal expansion of the ceramic case, wherein the second conductive mounting tab has a second coefficient of thermal expansion greater than the first coefficient of thermal expansion.

19. The semiconductor package of claim 18, further comprising:
a first lead extending out of the ceramic case, the first lead extending through a first washer mounted on a sidewall of the ceramic case; and
a second lead extending out of the ceramic case, the second lead extending through a second washer mounted on the sidewall.

20. The semiconductor package of claim 18, wherein the third conductive mounting tab is shorter than the first conductive mounting tab.

* * * * *